(12) United States Patent
Iwatsu

(10) Patent No.: US 6,268,900 B1
(45) Date of Patent: Jul. 31, 2001

(54) ACCOMMODATING APPARATUS AND SUBSTRATE PROCESSING SYSTEM

(75) Inventor: Haruo Iwatsu, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/406,829

(22) Filed: Sep. 28, 1999

(30) Foreign Application Priority Data

Sep. 28, 1998 (JP) .................................................. 10-288678

(51) Int. Cl.⁷ .............................. G03B 27/32; G03D 5/00; G03D 3/08
(52) U.S. Cl. ............................... 355/27; 396/611; 396/612
(58) Field of Search .............................. 355/27, 100, 106, 355/28–29; 399/233; 118/715, 720; 414/935–937, 416, 225; 396/611, 612

(56) References Cited

U.S. PATENT DOCUMENTS

| | | | |
|---|---|---|---|
| 5,202,716 | * | 4/1993 | Tateyama et al. .................... 354/319 |
| 5,442,416 | * | 8/1995 | Tateyama et al. .................... 354/319 |
| 5,664,254 | * | 9/1997 | Ohkura et al. ........................ 396/612 |
| 5,863,680 | * | 1/1999 | Kawakubo et al. .................... 430/22 |
| 5,910,010 | * | 6/1999 | Nishizawa et al. .................... 438/15 |
| 5,943,230 | * | 8/1999 | Rinnen et al. ........................ 364/147 |
| 5,993,081 | * | 11/1999 | Itoh et al. ............................. 396/611 |

FOREIGN PATENT DOCUMENTS 9-219433    8/1997    (JP) .

* cited by examiner

Primary Examiner—Russell Adams
Assistant Examiner—Hung Henry Nguyen
(74) Attorney, Agent, or Firm—Rader, Fishman & Grauer

(57) ABSTRACT

When a glass substrate is conveyed from a processing device group side to an accommodating apparatus, the glass substrate is accommodated to a first accommodating portion corresponding to the layer formed on the glass substrate. When a predetermined number of glass substrates have been accommodated to each accommodating portion, glass substrats accommodated in each accommodating portion corresponding to the layer of the glass substrates are conveyed to an exposing device side. After the exposing device has performed an exposing process for glass substrates, they are successively accommodated to the relevant accommodating portion. In the order of which glass substrates have been conveyed from the processing device group side to the accommodating apparatus, the glass substrates are returned to the processing device side.

15 Claims, 10 Drawing Sheets

ACCOMMODATING APPARATUS AND SUBSTRATE PROCESSING SYSTEM

BACKGROUND OF THE INVENTION

1. Field of the Invention

The present invention relates to an accommodating apparatus for temporarily accommodating a glass substrate for use with a semiconductor wafer, a liquid crystal display (LCD), or the like before or after a process by an exposing device. The present invention also relates to a substrate processing system having such an accommodating apparatus.

2. Description of the Related Art

In a step for forming a TFT (Thin Film Transistor) array for an LCD, a sequence of a thin film forming pre-cleaning step, a thin film forming step, a resist coating step, an exposing step, a developing step, an etching step, and a resist peeling-off step is repeated the number of times corresponding to the number of layers formed on one glass substrate (for example, the sequence is repeated six times).

In the resist coating step, the exposing step, and the developing step, a structure of which for example a coating/developing device and an exposing device are connected is used. An arm type conveying device, an AGV (Automated Guided Vehicle), or the like conveys a glass substrate from an upstream device to the coating/exposing/developing device.

However, the process performance of the coating/exposing/developing device is higher than that of other devices. In other words, the process time of the coating/exposing/developing device is shorter than that of the other devices. Thus, when such a sequence of steps is repeated six times, even if devices corresponding to the number of layers are disposed (namely, six devices are disposed), one coating/exposing/developing device can sufficiently process glass substrates.

In an exposing device, however, a reticle should be replaced for each layer. However, in such a sheet processing system, after a substrate with a first layer is loaded from the down-stream device to the coating/exposing/developing device, a substrate with a second layer may be loaded to the coating/exposing/developing device. Thereafter, a substrate with a fifth layer may be loaded. In other words, since glass substrates with different layers are loaded at random, when glass substrates are processed by the exposing device in the order of which they have been loaded, reticles should be frequently replaced. Thus, the process time of the exposing process becomes long.

SUMMARY OF THE INVENTION

The present invention is made from the above-described point of view. An object of the present invention is to solve such a problem and to provide an accommodating apparatus and a substrate processing system that allow a particular device such as an exposing device not to frequently replace reticles and thereby improve the process efficiency.

A first aspect of the present invention is an accommodating apparatus for temporarily accommodating a substrate on which a plurality of layers are formed at steps for forming the layers, the accommodating apparatus comprising a conveying path having a first end and a second end, substrates being successively conveyed from the first end, the second end being connected to a predetermined device, a plurality of accommodating portions disposed corresponding to a plurality of layers of the substrates, said accommodating portions being disposed along said conveying path, each of said accommodating portions accommodating a predetermined number of substrates, a conveying device travelable on said conveying path, said conveying device conveying, loading, and unloading the substrates among the first end and the second end of said conveying path and each of said accommodating portions, a means for inputting layer information of the layer of each substrate conveyed from the first end of said conveying path, and a means for loading a substrate conveyed from the first end of said conveying path to a relevant accommodating portion corresponding to the layer of the substrate through said conveying device and successively unloading substrates from the relevant accommodating portion to the predetermined device through said conveying device when the relevant accommodating portion accommodates a predetermined number of substrates.

A second aspect of the present invention is an accommodating apparatus for temporarily accommodating a substrate on which a plurality of layers are formed at steps for forming the layers, the accommodating apparatus comprising a conveying path having a first end and a second end, substrates being successively conveyed from the first end, the second end being connected to a predetermined device, a plurality of first accommodating portions disposed corresponding to a plurality of layers of the substrates, said first accommodating portions being disposed along one side of said conveying path, each of said first accommodating portions accommodating a predetermined number of substrates, a plurality of second accommodating portions disposed corresponding to a plurality of layers of the substrates, said second accommodating portions being disposed along the other side of said conveying path, each of said second accommodating portions accommodating a predetermined number of substrates, a conveying device travelable on said conveying path, said conveying device conveying, loading, and unloading the substrates among the first end and the second end of said conveying path, each of said first accommodating portions, and each of said second accommodating portions, a means for inputting layer information of the layer of each substrate conveyed from the first end of said conveying path, a means for storing the input layer information, a means for loading a substrate conveyed from the first end of said conveying path to a relevant first accommodating portion corresponding to the layer of the substrate through said conveying device, a means for successively unloading substrates from the relevant first accommodating portion to the predetermined device through said conveying device when the relevant first accommodating portion accommodates a predetermined number of substrates, a means for loading a substrate from the predetermined device to a relevant second accommodating portion corresponding to the layer of the substrate through said conveying device while a substrate conveyed from the first end of said conveying path is being loaded to a relevant first accommodating portion corresponding to the layer of the substrate through said conveying device, and a means for unloading substrates accommodated in a relevant second accommodating portion from the first end of said conveying path through said conveying device in the order of which the substrates have been loaded from the first end of said conveying path to the relevant second accommodating portion corresponding to the stored layer information through said conveying device.

A third aspect of the present invention is an substrate processing system for forming a first layer and a second layer on a substrate, the substrate processing system comprising an exposing device having a mechanism for replacing a first reticle corresponding to the first layer with a second reticle corresponding to the second layer or vice versa, and an accommodating device for temporarily accommodating a substrate, wherein said accommodating device comprises a conveying path having a first end and a second end, substrates being successively conveyed from the first end, the second end being connected to said exposing device, a first accommodating portion, disposed along the conveying path, for accommodating a first number of substrates with a first layer, a second accommodating portion, disposed along the conveying path, for accommodating a second number of substrates with a second layer, a conveying device travelable on the conveying path and for conveying, loading, and unloading substrates among the first end and the second end of the conveying path, the first accommodating portion, and the second accommodating portion, a means for inputting layer information that represents whether the layer formed on a substrate conveyed from the first end of the conveying path is the first layer or the second layer, and a controlling means for loading a substrate to the first accommodating portion through the conveying device when the substrate is conveyed from the first end of the conveying path corresponding to the input layer information that represents the first layer, for loading a substrate to the second accommodating portion through the conveying device when the substrate is conveyed from the first end of the conveying path corresponding to the input layer information that represents the second layer, for replacing a current reticle with the first reticle in said exposing device and successively unloading substrates from the first accommodating portion to the exposing device through the conveying device when the first number of substrates have been accommodated to the first accommodating portion, and for replacing the current reticle with the second reticle and successively unloading substrates from the second accommodating portion to the exposing device through the conveying device when the second number of substrates have been accommodated to the second accommodating portion.

A fourth aspect of the present invention is a substrate processing system for forming a first layer and a second layer on a substrate, comprising an exposing device having a mechanism with a substrate loading opening and a substrate unloading opening, the mechanism replacing a current reticle with a first reticle corresponding to a first layer or a second reticle corresponding to a second layer, and an accommodating device for temporarily accommodating substrates, wherein said accommodating device comprises a first conveying path having a first end and a second end, substrates being successively conveyed from the first end, the second end being connected to the substrate loading opening side, a second conveying path having a first end and a second end, substrates being successively conveyed from the first end, the second end being connected to the substrate unloading opening side, a first accommodating portion, disposed along the first conveying path, for accommodating substrates with the first layer, a second accommodating portion, disposed along the first conveying path, for accommodating substrates with the second layer, a third accommodating portion, disposed along the second conveying path, for accommodating substrates with the first layer, a fourth accommodating portion, disposed along the second conveying path, for accommodating substrates with the second layer, a first conveying device travelable on the first conveying path and for conveying, loading, and unloading a substrate among the first end and the second end of the first conveying path, the first accommodating portion, and the second accommodating portion, and a second conveying device travelable on the second conveying path and for conveying, loading, and unloading a substrate among the first end and the second end of the second conveying path, the third accommodating portion, and the fourth accommodating portion.

According to the present invention, accommodating portions corresponding to layers of substrates are disposed. Corresponding to input layer information, a substrate conveyed from the first end of the conveying path is loaded to an accommodating portion corresponding to the layer of the substrate. When a predetermined number of substrates have been accommodated to an accommodating portion, since the substrates are successively unloaded from the accommodating portion to the predetermined device, it is not necessary to cause the predetermined device to frequently replace a reticle. Thus, the process efficiency is improved.

In addition, according to the present invention, input layer information is stored. Corresponding to the stored layer information, substrates accommodated in an accommodating portion are unloaded in the order of which the substrates have been loaded to the accommodating portion. Thus, although the accommodating apparatus according to the present invention is disposed on a fabrication line, it is not necessary to add a special means to a device connected to the first end of the conveying path.

In addition, according to the present invention, first accommodating portions corresponding to layers of substrates are disposed on one side of a conveying path. Second accommodating portions corresponding to layers of substrates are disposed on the other side of the conveying path. A substrate conveying operation from/to the first end side of the conveying path is performed for the first accommodating portions, while a substrate loading/unloading operation with a predetermined device is being performed for the second accommodating portion. Thus, the conveying efficiency is further improved.

Since each accommodating portion according to the present invention accommodates many substrates, when a TFT array forming process (namely, a thin film forming pre-cleaning step, a thin film forming step, a resist coating step, an exposing step, a developing step, an etching step, and a resist peel-off step) is structured as one system, the accommodating portions can be used as buffers that save substrates if any portion of the system gets defective. In addition, the accommodating portions according to the present invention function as buffers that absorb a deviation of tact between for example an exposing device side and another device side. Thus, the accommodating apparatus according to the present invention is preferred to be disposed upstream or downstream of the exposing device.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, an embodiment of the present invention will be described.

Figure 1:
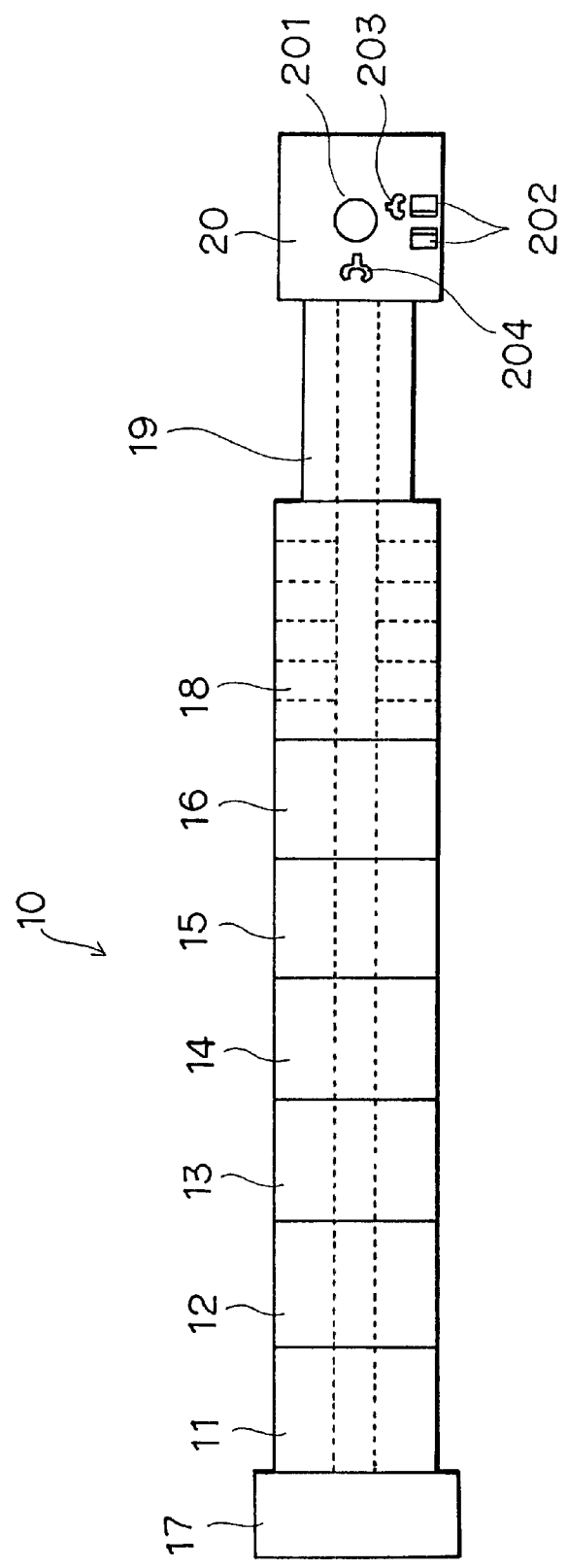
FIG. 1 is a plan view showing a TFT array forming system according to an embodiment of the present invention.

FIG. 1 is a plan view showing the structure of a TFT array forming system according to an embodiment of the present invention.

Referring to FIG. 1, the TFT array forming system 10 has a predetermined number of sets of processing device groups 11 to 16 such as cleaning devices, thin film forming devices, etching devices, ashing devices, and inspecting devices that perform thin film forming pre-cleaning process, thin film forming process, etching process, resist peel-off process, and inspecting process, respectively. The predetermined number of sets of the processing device groups corresponds to the number of layers of glass substrates G. For example, six sets of the processing device groups are disposed. The six sets of the processing device groups are adjacently connected. A substrate loading/unloading portion 17 is connected to the processing device group 11 disposed at the most upstream position of the system. The substrate loading/unloading portion 17 loads a raw glass substrate G (on which a TFT array has not been formed) to the system. In addition, the substrate loading/unloading portion 17 unloads a glass substrate G with a TFT array from the system to the outside. On the other hand, an accommodating apparatus 18 according to the present invention is connected to the processing device group 16 disposed at the most downstream position of the system. In each of the processing device groups 11 to 16, a conveying device (not shown) is disposed. The conveying device conveys a glass substrate G among the substrate lading/unloading portion 17, the processing device groups, and the accommodating apparatus 18. The accommodating apparatus 18 is connected to a resist coating/developing device 19 and an exposing device 20 in the order. The exposing device 20 has a wafer table 201 and a light radiating means (not shown). A cassette 202 is disposed on one side of the exposing device 20. The cassette 202 accommodates reticles R. The exposing device 20 has two conveying arms 203 and 204. The first conveying arm 203 conveys a reticle R between the cassette 202 and the wafer table 201. The second conveying arm 204 conveys a glass substrate G between the wafer table 201 and a transferring portion 30 that will be described later (see FIG. 2). The conveying arms 203 and 204 can travel on each of the X, Y, and Z axes and rotate about the Z axis for θ degrees. The exposing device 20 replaces a reticle R corresponding to a layer formed on a glass substrate G.

Figure 2:
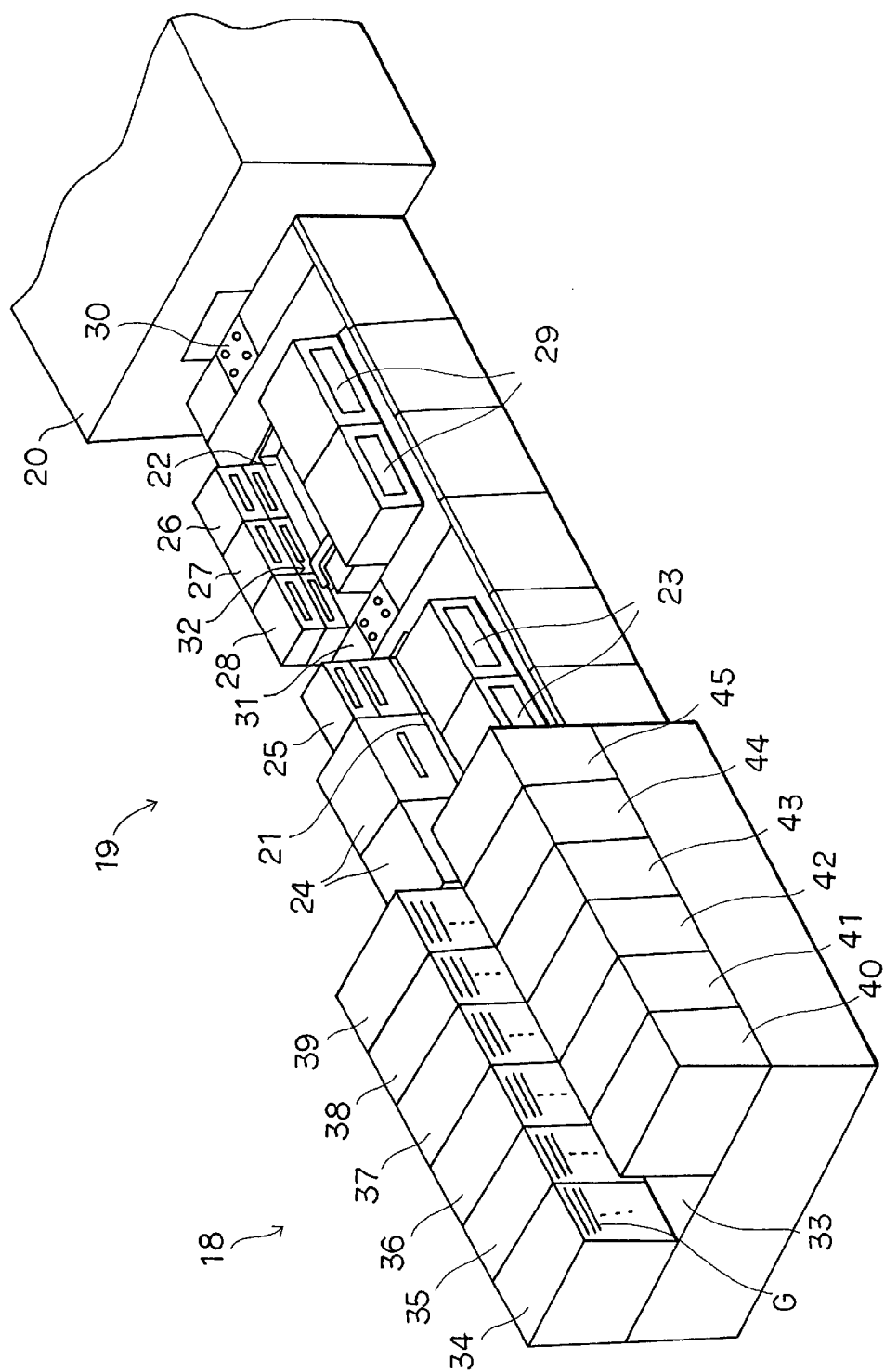
FIG. 2 is a perspective view showing the structures of an accommodating apparatus and a resist coating/developing device shown in FIG. 1.
Figure 3:
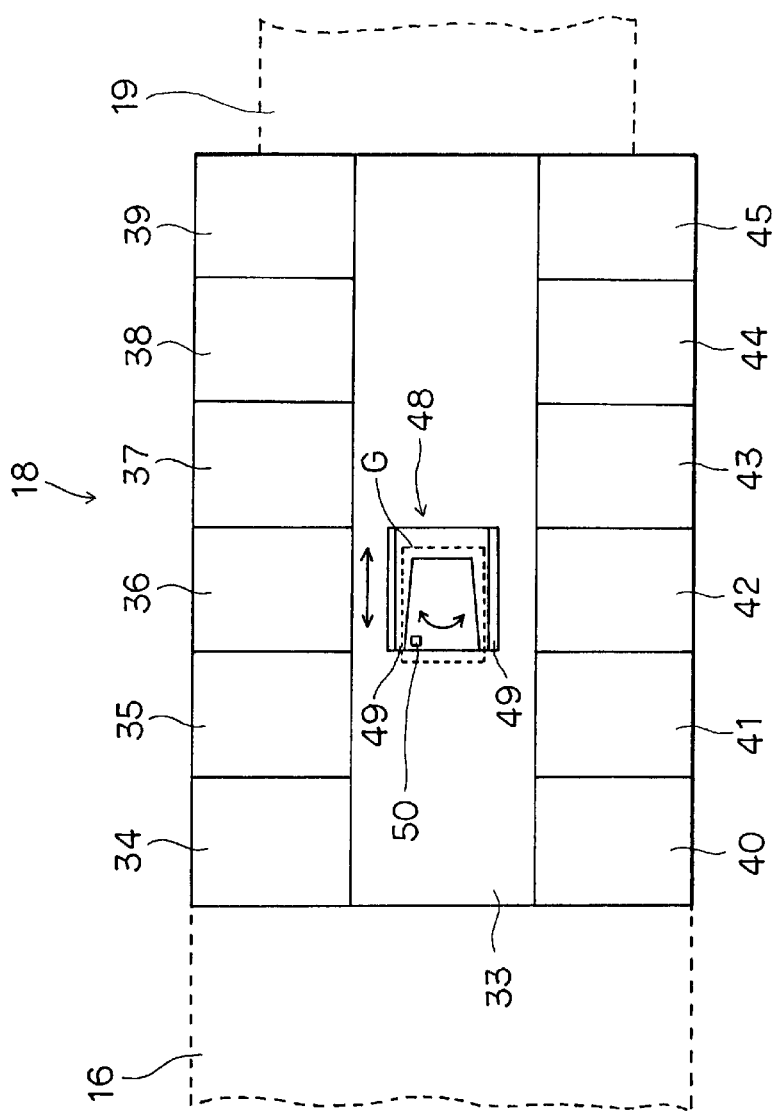
FIG. 3 is a plan view showing the structure of the accommodating device shown in FIGS. 1 and 2.
Figure 4:
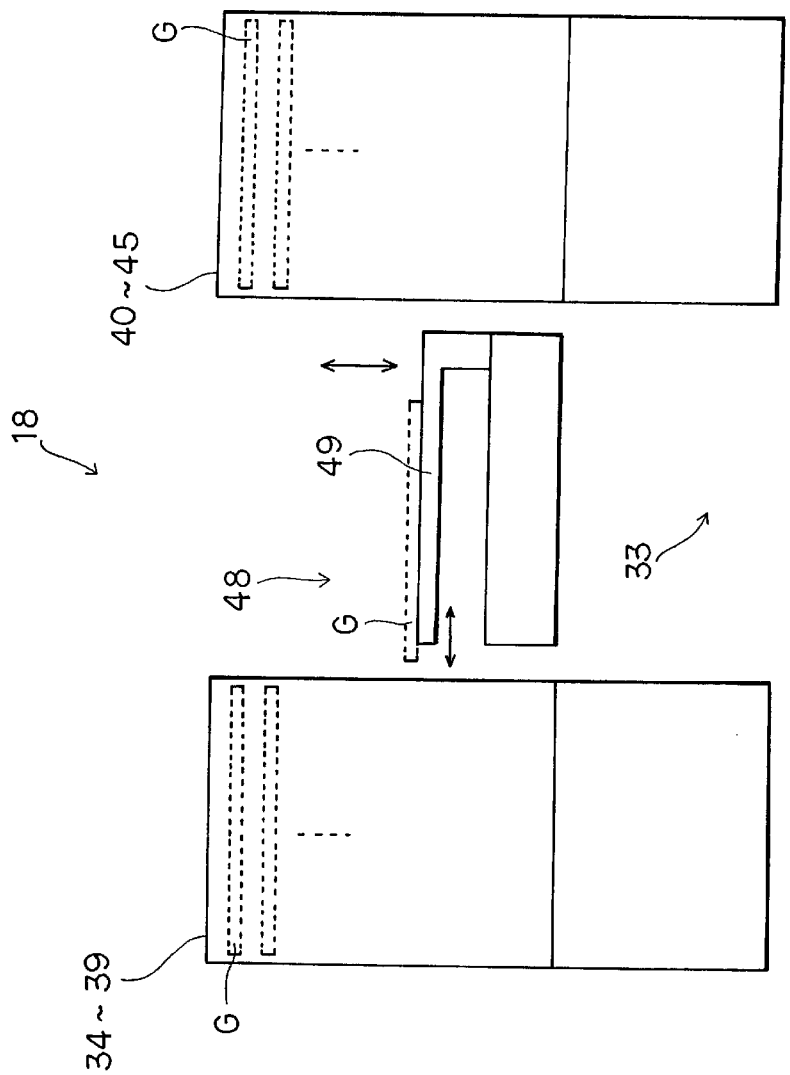
FIG. 4 is a side view showing the structure of the accommodating apparatus shown in FIGS. 1 and 2.

FIG. 2 is a perspective view showing the structures of the accommodating apparatus 18 and the resist coating/developing device 19 adjacently connected. FIG. 3 is a plan view showing the structure of the accommodating apparatus 18 shown in FIG. 2. FIG. 4 is a side view showing the structure of the accommodating apparatus 18 shown in FIG. 2.

As shown in FIG. 2, the resist coating/developing device 19 has corridor-shaped conveying paths 21 and 22 formed in the longitudinal direction. The conveying paths 21 and 22 are straightly formed through a transferring portion 31. Various processing devices that perform various processes for glass substrates G are disposed on both sides of the conveying paths 21 and 22.

For example, two cleaning devices 23 are adjacently disposed on one side of the conveying path 21. The first cleaning device 23 cleans a glass substrate G with a brush. The second cleaning device 23 cleans a glass substrate G with high pressure jet water. Two developing devices 24 are adjacently disposed on the other side of the conveying path 21. Two heat processing devices 25 that are stacked are disposed adjacent to one of the developing devices 24.

An adhesion device 26 is disposed on one side of the conveying path 22. The adhesion device 26 performs a hydrophobic process for a glass substrate G before being coated with resist solution thereon. A cooling device 27 is disposed below the adhesion device 26. Two rows and two stacks of (namely, four) heat processing devices 28 are disposed adjacent to the cooling device 27. A resist coating device 29 is disposed on the other side of the conveying path 22. The resist coating device 29 coats the front surface of a glass substrate G with resist solution so as to form a resist film thereon. The transferring portion 30 is disposed on one end side of the conveying path 22. The transferring portion 30 transfers a glass substrate G with the exposing device 20.

An arm type conveying device (not shown) travels on the conveying path 21 and transfers a glass substrate G with the processing devices on both the sides of the conveying path 21, the transferring portion 31, and the accommodating apparatus 18. An arm type conveying device 32 travels on the conveying path 22 and transfers a glass substrate G with the processing devices disposed on both the sides of the conveying path 22, the transferring portion 31, and the transferring portion 30.

In addition, as shown in FIGS. 2 to 4, the accommodating apparatus 18 has a corridor-shaped conveying path 33. The conveying path 33 is formed in the longitudinal direction at the center of the accommodating apparatus 18. Accommodating portions 34 to 44 are disposed on both sides of the conveying path 33. The accommodating portions 39 to 44 accommodate glass substrates G.

First accommodating portions 34 to 39, the number of which correspons to the number of layers formed on glass substrates G (in this case, six first accommodating portions 34 to 39) are disposed on one side of the conveying path 33. The first accommodating portions 34 to 39 temporarily accommodate glass substrates G. Likewise, second accommodating portions 40 to 45, the number of which corresponds to the number of layers formed on glass substrates G (in this case, six second accommodating portions 40 to 45) are disposed on the other side of the conveying path 33. The second accommodating portions 40 to 45 temporarily accommodate glass substrates G. As will be described later, according to the present invention, the first accommodating portions 34 to 39 and the second accommodating portions 40 to 45 are used for loading and unloading glass substrates G, respectively.

Figure 5:
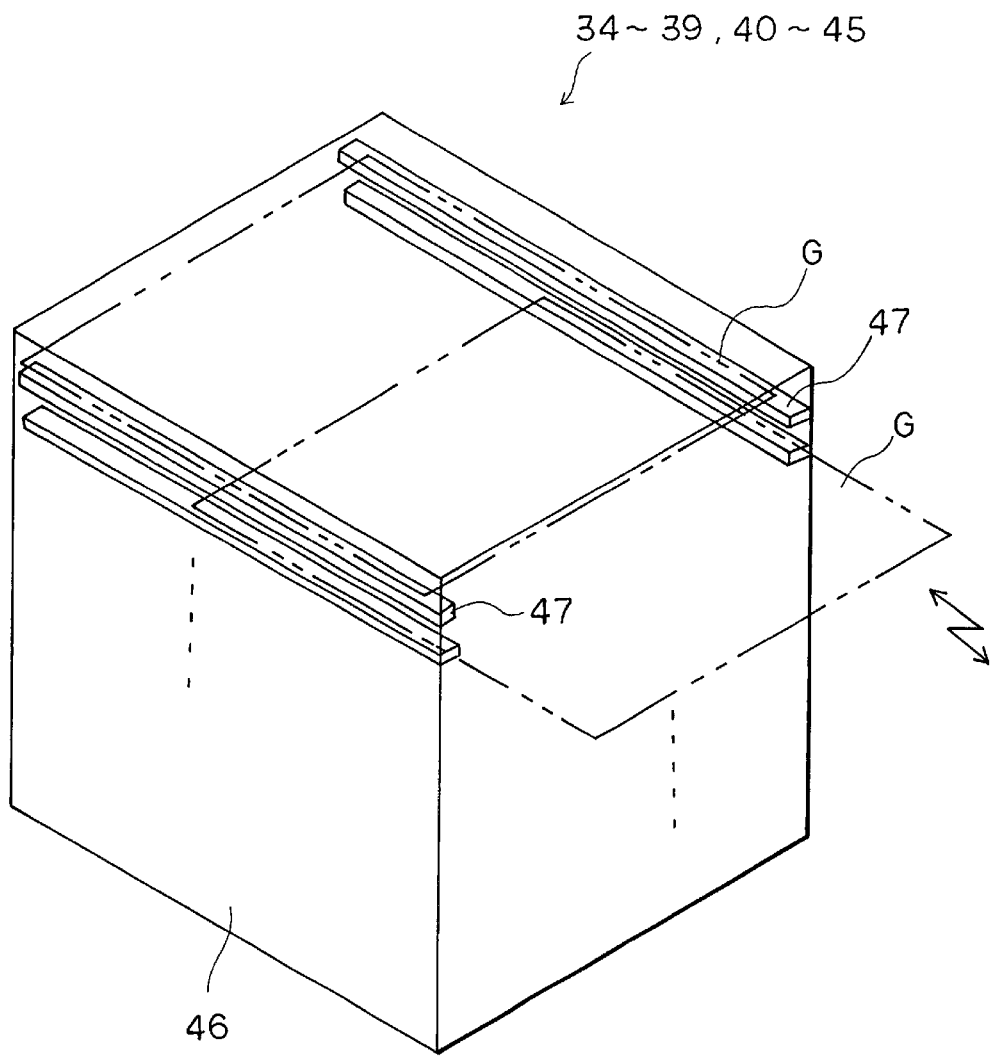
FIG. 5 is a perspective view showing the structures of a first accommodating portion and a second accommodating portion shown in FIG. 2.

As shown in FIG. 5, each of the first accommodating portions 34 to 39 and the second accommodating portions 40 to 45 is composed of a box 46 having a substrate loading/unloading opening facing the conveying path 33. Holding guide members 47 are disposed on left and right inner walls of the box 46. The holding guide members 47 guide and hold a glass substrate G in the box 46. The holding guide members 47 are composed of a pair of a left member and a right member. The box 46 has a plurality of pairs of the holding guide members 47 (for example, the box 46 has 20 pairs of the holding guide members 47). In this case, each box 46 accommodates 20 glass substrates G. In this example, one lot contains 20 glass substrates G. However, it should be noted that the number of glass substrates G accommodated in one accommodating portion may not match the predetermined lot.

Among the first accommodating portions 34 to 39, for example the first accommodating portion 34 accommodates glass substrates G of which the first layer is processed; the first accommodating portion 35 accommodates glass substrates G of which the second layer is processed; the first accommodating portion 36 accommodates glass substrates G of which the third layer is processed; the first accommodating portion 37 accommodates glass substrates G of which the fourth layer is processed; the first accommodating portion 38 accommodates glass substrates G of which the fifth layer is processed; and the first accommodating portion 39 accommodates glass substrates G of which the sixth layer is processed. Likewise, among the second accommodating portions 40 to 45, for example the second accommodating portion 40 accommodates glass substrates G of which the first layer is processed; the second accommodating portion 41 accommodates glass substrates G of which the second layer is processed; the second accommodating portion 42 accommodates glass substrates G of which the third layer is processed; the second accommodating portion 43 accommodates glass substrates G of which the fourth layer is processed; the second accommodating portion 44 accommodates glass substrates G of which the fifth layer is processed; and the second accommodating portion 45 accommodates glass substrates G of which the sixth layer is processed.

An arm type conveying device 48 travels on the conveying path 33. The conveying device 48 has a pair of arms 49. The pair of arms 49 hold a glass substrate G. The pair of arms 49 is traveled along the conveying path 33 by a driving device (not shown). In addition, the pair of arms 49 can be lifted up and down, rotated on a plane, and extended and retreated. Thus, the conveying device 48 can transfer a glass substrate G with each of the conveying devices (not shown) of the first accommodating portions 34 to 39, the second accommodating portions 40 to 45, the processing device groups 11 to 16, and the resist coating/developing device 19. It should be noted that the conveying device 48 may have two or three pairs of arms 49 that are disposed at vertical positions.

In addition, for example, the conveying device 48 has a reading device 50. The reading device 50 reads layer information that represents the currently processed layer formed on a glass substrate G and recognizes the layer. With the reading device 50, the conveying device 48 can recognize the currently processed layer of a glass substrate G conveyed from one of the processing device groups 11 to 16. Thus, the conveying device 48 can quickly and smoothly convey the glass substrate G to a relevant accommodating portion. However, when the processing device groups 11 to 16 send layer information of a glass substrate G to the conveying device 48 or when glass substrates G are conveyed from the processing device groups 11 to 16 to the conveying device 48 in a predetermined order, the reading device 50 may be omitted.

Figure 6:
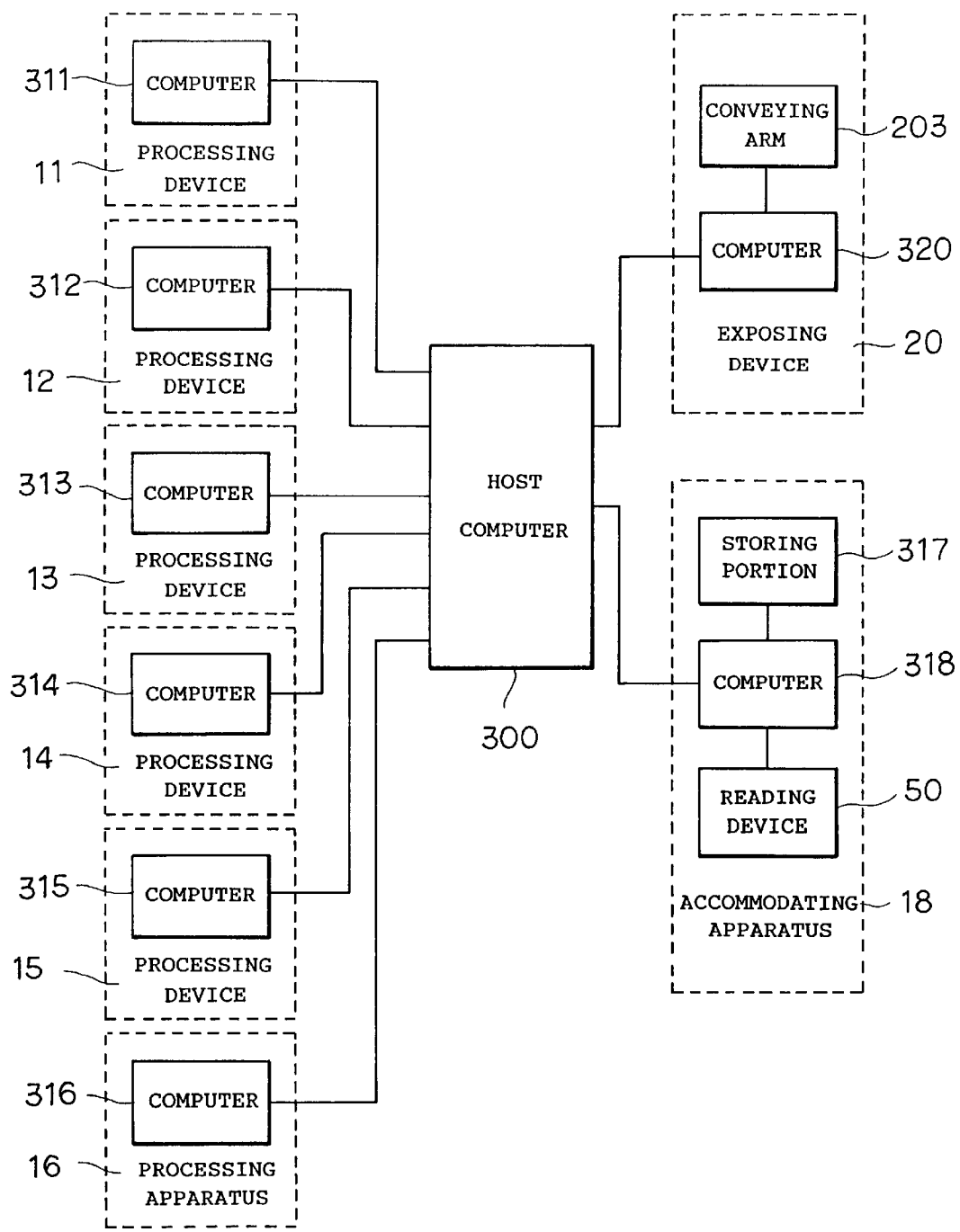
FIG. 6 is a block diagram showing the structure of a controlling portion of the TFT array forming system shown in FIG. 1.

FIG. 6 is a block diagram showing the structure of a controlling portion of the TFT array forming system 10.

Referring to FIG. 6, a host computer 300 manages the TFT array forming system 10. Computers 311 to 316 for the processing device groups 11 to 16, a computer 318 for the accommodating apparatus 18, a computer 319 for the resist coating/developing device 19, a computer 320 for the exposing device 20, and so forth are connected to the host computer 300.

Layer information that is read by for example the reading device 50 is input to the computer 318 for the accommodating apparatus 18. Thus, the computer 318 recognizes the currently processed layer of a glass substrate G and performs a controlling process that will be described later. In addition, under the control of the computer 320 for the exposing device 20, the conveying arm 203 replaces a reticle R with a new one corresponding to the currently processed layer of the glass substrate G. Moreover, the computers 311 to 316 for the processing device groups 11 to 16 send layer information of glass substrates G to the host computer 300.

The computer 318 for the accommodating apparatus 18 causes a glass substrate G to be accommodated in a relevant accommodating portion corresponding to the layer information. In addition, a storing portion 317 stores the layer information. Glass substrates G are returned from accommodating portions to the processing device groups 11 to 16 in the order of which the glass substrates G have been conveyed from the processing device groups 11 to 16 to the accommodating apparatus 18. This operation will be described later.

Next, the operation of the accommodating apparatus 18 will be described.

When glass substrates G are conveyed from the processing device groups 11 to 16 to the accommodating apparatus 18, the conveying device 48 successively receives the glass substrates G. The reading device 50 of the conveying device 48 recognizes the currently processed layer of each glass substrate G. The conveying device 48 successively conveys and loads the glass substrates G to the relevant accommodating portions 34 to 39 corresponding to the recognized layers. When the recognized layer of a glass substrate G is the third layer, the conveying device 48 loads the glass substrate G to the first accommodating portion 36.

After the above-described accommodating operation is repeated, when 20 glass substrates G are accommodated in each of the first accommodating portions 34 to 39, glass substrates G accommodated therein are successively loaded to the resist coating/developing device 19. The resist coating/developing device 19 successively coats the glass substrates G with resist and then successively loads the resultant glass substrates G to the exposing device 20. The exposing device 20 replaces a reticle with a new one corresponding to the currently processed layer on the glass substrates G and performs an exposing process for the glass substrates G. Thereafter, the resultant glass substrates G are conveyed to the resist coating/developing device 19. The resist coating/developing device 19 performs a developing process for the glass substrates G and conveys the resultant glass substrates G to the accommodating apparatus 18. While such an operation is being performed, glass substrates G are conveyed from the processing device groups 11 to 16 to the accommodating apparatus 18. As with the operation of the first accommodating portions 34 to 39, the glass substrates G are successively accommodated to the relevant second accommodating portions 40 to 45.

After glass substrates G are conveyed from the first accommodating portions 34 to 39 to the exposing device 20 and the glass substrates G are processed in the exposing device 20, the resultant glass substrates G are successively accommodated to the first accommodating portions 34 to 39. When 20 glass substrates G are accommodated to each of the first accommodating portions 34 to 39, the conveying device 48 successively returns the glass substrates G from the accommodating apparatus 18 to the processing device groups 11 to 16 in the order of which the glass substrates G have been conveyed from the processing device groups 11 to 16 to the accommodating apparatus 18. While such an operation is being performed, as with the operation of the first accommodating portions 34 to 39, glass substrates G accommodated in each of the second accommodating portions 40 to 45 are successively conveyed to the resist coating/developing device 19. The resist coating/developing device 19 successively performs a resist coating process for the glass substrates G. Thereafter, the resultant glass substrate G are successively conveyed to the exposing device 20. The exposing device 20 successively performs an exposing process for the glass substrates G. The resultant glass substrates G are successively conveyed to the resist coating/developing device 19. The resist coating/developing device 19 successively performs a developing process for the glass substrates G. Thereafter, the resultant glass substrates G are successively returned to the relevant one the second accommodating portions 40 to 45.

While glass substrates G are being loaded to the first accommodating portions 34 to 39, glass substrats G are unloaded from the second accommodating portions 40 to 45. In contrast, while glass substrates G are being unloaded from the first accommodating portions 34 to 39, glass substrates G are loaded to the second accommodating portions 40 to 45.

Now, a glass substrate G of which the first layer is currently processed is denoted by A; a glass substrate G of which the second layer is currently processed is denoted by B; a glass substrate G of which the third layer is currently processed is denoted by C; a glass substrate G of which the fourth layer is currently processed is denoted by D; a glass substrate G of which the fifth layer is currently processed is denoted by E; and a glass substrate G of which the sixth layer is currently processed is denoted by F. In addition, numerals attached to the letters A to F represent the corresponding glass substrate G among the substrates for which the same layer has been processed.

In this case, glass substrates G are conveyed from the processing device groups 11 to 16 to the accommodating apparatus 18 in the following order:

A1, B1, B2, C1, C2, D1, A2, A3, B3, C3, D2, D3, D4, F1, G1, F2,

In addition, glass substrates G are conveyed from the accommodating apparatus 18 to the exposing device 20 in the following order:

A1, A2, . . . B, B2, . . . C1, C2, C3. . . , D1, D2, . . . , F1, F2, . . . G1

As with the order of glass substrates G conveyed from the processing device portions 11 to 16 to the accommodating apparatus 18, glass substrates G are conveyed from the accommodating apparatus 18 to the processing device groups 11 to 16 in the following order:

A1, B1, B2, C1, C2, D1, A2, A3, B3, C3, D2, D3, D4, . . . , F1, G1, F2, . . .

As described above, according to the embodiment of the present invention, since glass substrates G with the same layer are successively conveyed to the exposing device 20, the exposing device 20 replaces a reticle every for example 20 glass substrates G. Thus, the exposing process time can be shortened. In addition, since the accommodating apparatus 18 that functions as a large buffer is disposed between the exposing device 20 and the processing device groups 11 to 16, the fabrication loss time due to fluctuation of tact can be suppressed.

Since the accommodating apparatus 18 accommodates many glass substrates G, it can be used as a substrate escape buffer upon occurrence of a defect of the TFT array forming system. For example, if a defect takes place in one of the processing device groups 11 to 16, although the operation of the defective device is stopped, the operations of the other devices can be continued. Glass substrates G to be processed in the defective device are temporarily accommodated in the accommodating apparatus 18.

Next, a modification of the present invention will be described.

Figure 7:
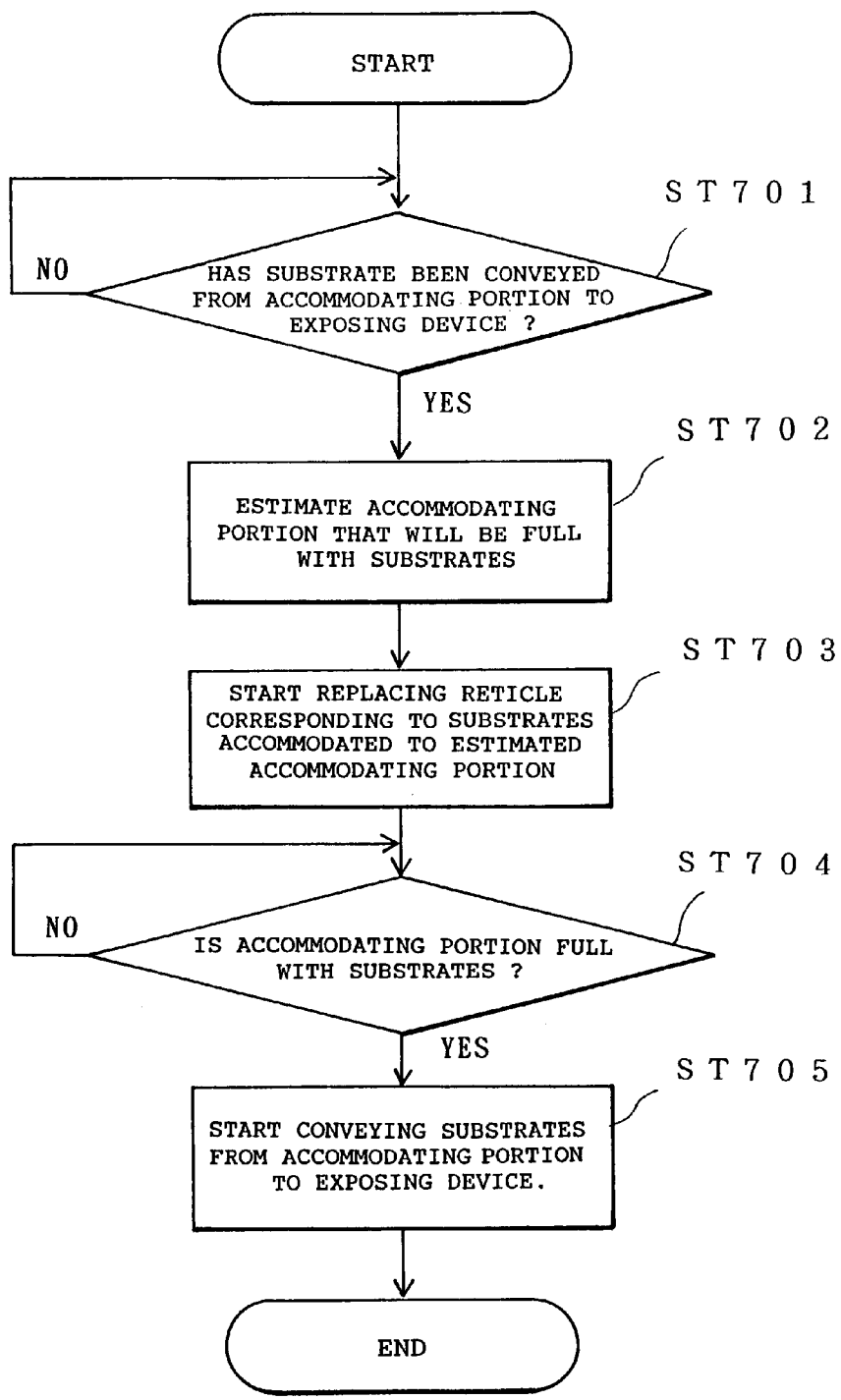
FIG. 7 is a flow chart showing the process according to a modification of the present invention.

FIG. 7 is a flow chart showing a process of the host computer 301 according to a modification of the present invention.

Under the control of the host computer 301, after a glass substrate G is conveyed from for example the first accommodating portion 34 to the exposing device 20 (at step 701), it is estimated which of the first accommodating portions 34 to 39 will accommodate 20 glass substrates 20 (at step 702). Before the estimated one of the first accommodating portion 34 to 39 accommodates 20 glass substrates G, the exposing device 20 starts replacing a reticle R corresponding to the glass substrates G (at step 703). When the estimated first accommodating portion accommodates 20 glass substrates G (at step 704), the glass substrates G are successively conveyed from the first accommodating portion to the exposing device 20 (at step 705).

At step 702, the first accommodating portion is estimated corresponding to system information or the like sent from for example the computers 311 to 316 for the processing device groups 11 to 16 to the host computer 300. The system information is information that represents processes that for example the processing device groups 11 to 16 perform for glass substrates G.

With such an estimating operation, the exposing device 20 can quickly replace a reticle R with a new one.

It should be noted that the present invention is not limited to the above-described embodiment. Instead, various modifications of the embodiment are available.

Figure 8:
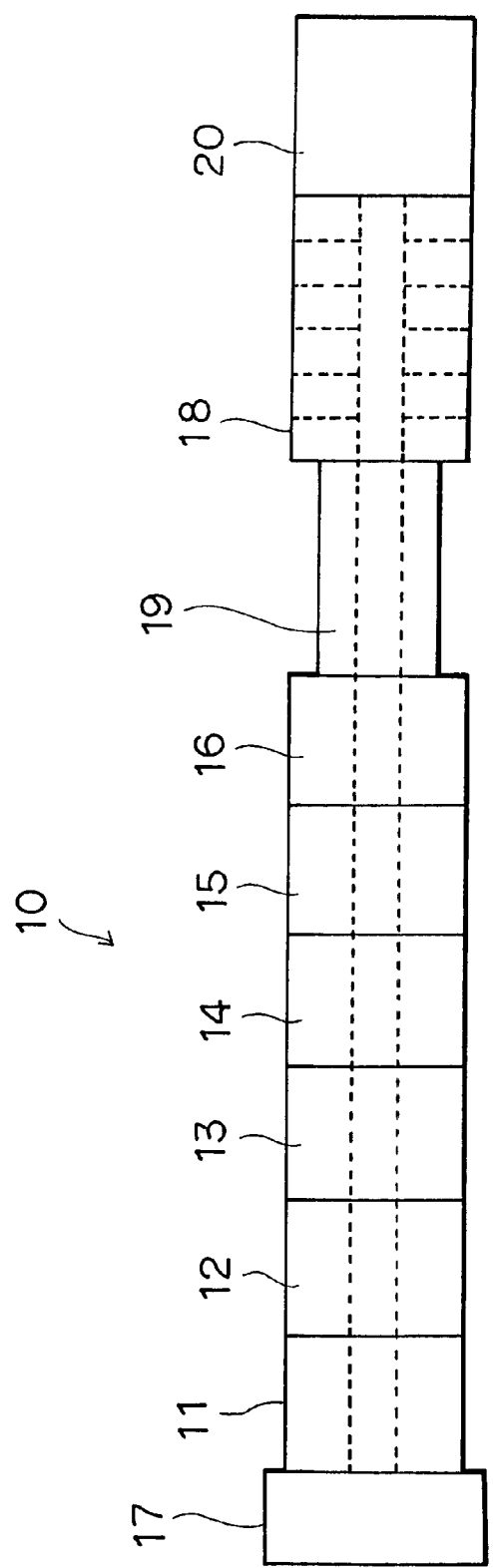
FIG. 8 is a plan view showing the structure of a system according to a modification of the present invention.

For example, in the above-described embodiment, the processing device groups 11 to 16, the accommodating apparatus 18, the resist coating/developing device 19, and the exposing device 20 are adjacently disposed in the order thereof. Instead, as shown in FIG. 8, processing device groups 11 to 16, a resist coating/developing device 19, an accommodating apparatus 18, and an exposing device 20 may be adjacently disposed in the order thereof. In other words, the accommodating apparatus 18 may be disposed between the resist coating/developing device 19 and the exposing device 20.

Figure 9:
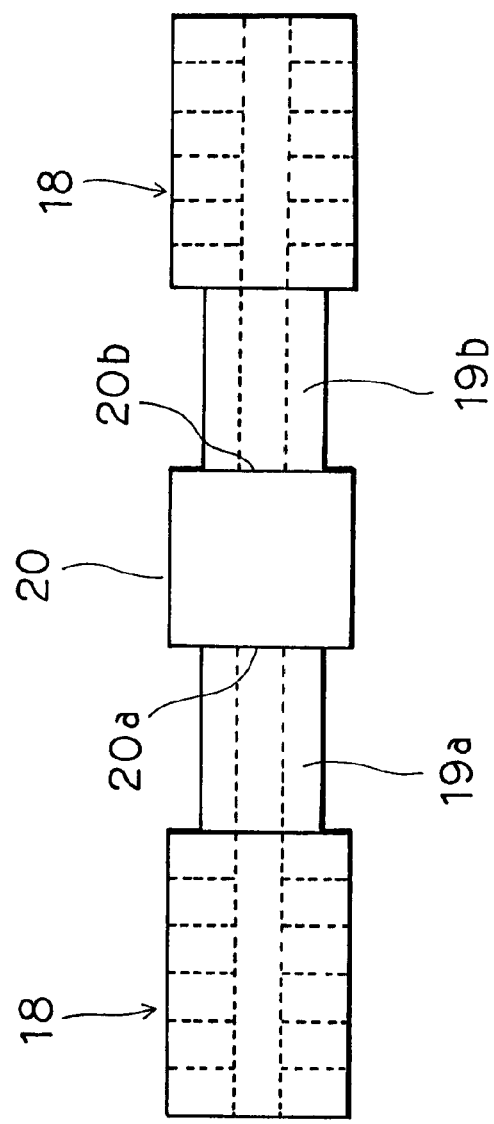
FIG. 9 is a plan view showing the structure of a system according to a modification of the present invention.

In addition, as shown in FIG. 9, when an exposing device 20 has a substrate loading opening 20a and a substrate unloading opening 20b, an accommodating apparatus 18 that has first accommodating portions 34 to 39 and second accommodating portions 40 to 45 may be structured in such a manner that the first accommodating portions 34 to 39 are disposed on the substrate loading opening 20a side through a resist coating device 19a and that the second accommodating portions 40 to 45 are disposed on the substrate unloading opening 20b side through a developing device 19b.

Figure 10:
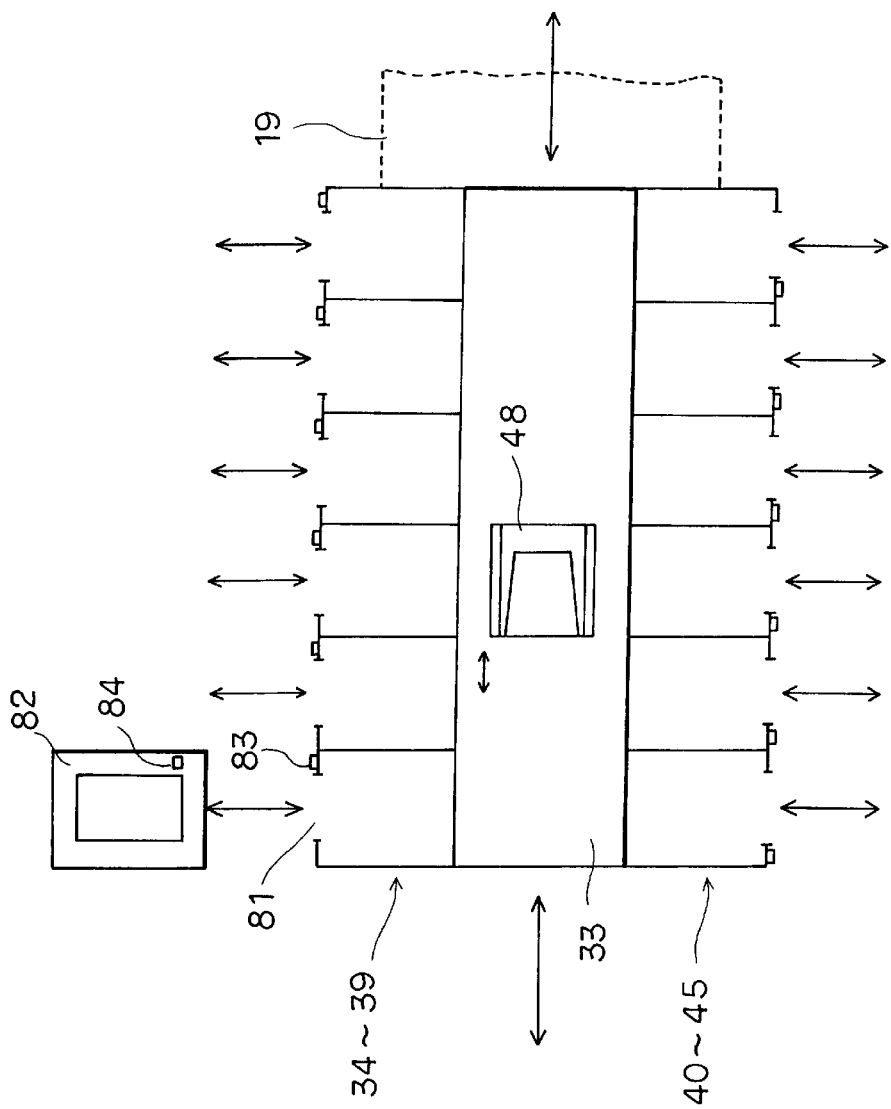
FIG. 10 is a plan view showing the structure of a system according to a modification of the present invention.

In the above-described embodiment, each of the accommodating portions has a substrate loading/unloading opening facing the conveying path. Instead, as shown in FIG. 10, each of first accommodating portions 34 to 39 and second accommodating portions 40 to 45 may have a substrate loading/unloading opening opposite to that facing the conveying path 33. In this case, glass substrates G can be loaded/unloaded on the rear side of each of the first accommodating portions 34 to 39 and the second accommodating portions 40 to 45. In this case, for example an automated guided vehicle (AGV) 82 transfers glass substrates G with the first accommodating portions 34 to 39 and the second accommodating portions 40 to 45 through their substrate loading/unloading openings 81. Thus, glass substrates G can be more effectively and quickly loaded and unloaded. In this case, first photoelectric converting portions 83 are disposed on the rear side of the first accommodating portions 34 to 39 and the second accommodating portions 40 to 45 so as to transmit and receive data. In addition, a second photoelectric converting portion 84 is disposed on the AGV 82 in such a manner that the second photoelectric converting portion 84 faces the first photoelectric converting portion 83. Thus, data is exchanged between the accommodating apparatus 18 and the AGV 82. Thus, the structure of a data transmitting/receiving portion can be simplified. Alternatively, an outer conveying path connected to another device along the substrate loading/unloading opening 81 may be formed instead of the use of the AGV 82. An outer conveying device that can travel on the outer conveying path may be disposed. The outer conveying device loads and unloads a glass substrate G to/from each accommodating portion through the substrate loading/unloading opening 81. In this case, one of the accommodating portions may be dedicated for transferring a glass substrate G between the conveying device 48 and the outer conveying device. In this case, it is not necessary to allow the dedicated transferring portion to accommodate a plurality of glass substrates G.

In the above-described embodiment, the processing device groups 11 to 16, the accommodating apparatus 18, the resist coating/developing device 19, and the exposing device 20 are integrally disposed. The accommodating apparatus 18 is in-line structured. Alternatively, an AGV may be disposed between the processing device groups 11 to 16 and the accommodating apparatus 18 so as to convey a glass substrate G. The in-line structure is not limited to the system structure shown in FIG. 1.

In the above-described embodiment, the accommodating apparatus was described for use with an exposing device. Of course, the accommodating apparatus can be used for other than an exposing device.

In addition to a device that accommodates TFT array glass substrates, the present invention can be applied to a device that accommodates semiconductor wafers with the same effect of the present invention. Of course, the present invention can be applied to a device that accommodates other types of substrates such as color filters.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An accommodating apparatus for temporarily accommodating a substrate on which a plurality of layers are formed at steps for forming the layers, the accommodating apparatus comprising:

a conveying path having a first end and a second end, the substrates successively conveyed from the first end, the second end connected to a predetermined substrate processing device;

a plurality of accommodating portions disposed corresponding to a plurality of layers of the substrates, said accommodating portions disposed along said conveying path, each of said accommodating portions accommodates a predetermined number of substrates;

a conveyor travelable on said conveying path, said conveyor conveying, loading, and unloading the substrates among the first end and the second end of said conveying path and each of said accommodating portions; and a reader connected to the conveyor that reads layer information that represents a currently processed layer of each substrate conveyed from the first end of said conveying path;

said conveyor responsive to the layer information and loads a substrate conveyed from the first end of said conveying path to a relevant accommodating portion corresponding to the layer of the substrate through said conveyor and successively unloading substrates from the relevant accommodating portion to the predetermined substrate processing device through said conveyor when the relevant accommodating portion accommodates a predetermined number of substrates.

2. The accommodating apparatus as set forth in claim 1, further comprising:

a memory that stores the input layer information; and said conveyor responsive to the layer information that loads substrates accommodated in a relevant accommodating portion from the first end of said conveying path through said conveyor in the order of which the substrates have been loaded from the first end of said conveying path to the relevant accommodating portion corresponding to the stored layer information through said conveyor.

3. The accommodating apparatus as set forth in claim 1, wherein the predetermined substrate processing device is an exposing device.

4. The accommodating apparatus as set forth in claim 1, wherein the reader reads an identifier of a layer formed on a substrate so as to recognize the layer of the substrate.

5. The accommodating apparatus as set forth in claim 4, wherein the reading device is disposed in said conveyor.

6. The accommodating apparatus as set forth in claim 1, wherein each of said accommodating portions has a substrate loading/unloading opening on the opposite side of said conveying path.

7. The accommodating apparatus as set forth in claim 6, further comprising:

an outer conveying path formed along the substrate loading/unloading opening; and an outer conveyor travelable on said outer conveying path so as to load and unload substrates to/from said accommodating portions through their substrate loading/unloading openings.

8. The accommodating apparatus as set forth in claim 6, wherein a substrate is transferred with an automated guided vehicle through the substrate loading/unloading opening.

9. The accommodating apparatus as set forth in claim 8, wherein each of said accommodating portions has a first photoelectric converting portion, disposed in the vicinity of the substrate loading/unloading opening, that transmits and receives data, and wherein the automated guided vehicle has a second photoelectric converting portion, disposed opposite to the first photoelectric converting portion, that transmits and receives data to/from the first photoelectric converting portion when the automated guided vehicle transfers a substrate with a relevant accommodating portion.

10. An accommodating apparatus for temporarily accommodating a substrate on which a plurality of layers are formed at steps for forming the layers, the accommodating apparatus comprising:

a conveying path having a first end and second end, substrates being successively conveyed from the first end, the second end being connected to a predetermined substrate processing device;

a plurality of first accommodating portions disposed corresponding to a plurality of layers of the substrates, said first accommodating portions being disposed along one side of said conveying path, each of said first accommodating portions accommodating a predetermined number of substrates;

a plurality of second accommodating portions disposed corresponding to a plurality of layers of the substrates, said second accommodating portions being disposed along the other side of said conveying path, each of said second accommodating portions accommodating a predetermined number of substrates;

a conveyor travelable on said conveying path, said conveyor conveying, loading, and unloading the substrates among the first end and the second end of said conveying path, each of said first accommodating portions, and each of said second accommodating portions;

a reader connected to the conveyor that reads layer information that represents a currently processed layer of each substrate conveyed from the first end of said conveying path;

a memory that stores the input layer information;

said conveyor responsive to the layer information that loads a substrate conveyed from the first end of said conveying path to a relevant first accommodating portion corresponding to the layer of the substrate through said conveying device;

an accommodating computer that outputs unloading instructions to the conveyor, said conveyor successively unloading substrates from the relevant first accommodating portion to the predetermined substrate processing device through said conveying device when the relevant first accommodating portion accommodates a predetermined number of substrates;

a first processing computer that outputs loading instructions to the conveyor said conveyor loading a substrate from the predetermined substrate processing device to a relevant second accommodating portion corresponding to the layer of the substrate through said conveyor while a substrate conveyed from the first end of said conveying path is being loaded to a relevant first accommodating portion corresponding to the layer of the substrate through said conveyor; and a second processing computer that outputs unloading instruction to the conveyor, said conveyor unloading substrates accommodates in a relevant second accommodating portion from the first end of said conveying path through said conveyor in the order of which the substrates have been loaded from the first end of said conveying path to the relevant second accommodating portion corresponding to the strored layer information through said conveyor.

11. A substrate processing system for forming a first layer and a second layer on a substrate, the substrate processing system comprising:

an exposing device having a mechanism that replaces a first reticle corresponding to the first layer with a second reticle corresponding to the second layer or vice versa; and an accommodating device that temporarily accommodates a substrate, wherein said accommodating device comprises:

a conveying path having a first end and a second end, substrates being successively conveyed from the first end, the second end being connected to said exposing device, a first accommodating portion, disposed along the conveying path, that accommodates a first number of substrates with a first layer, a second accommodating portion, disposed along the conveying path, that accommodates a second number of substrates with a second layer, a conveyor travelable on the conveying path that conveys, loads and unloads substrates among the first end and the second end of the conveying path, the first accommodating portion, and the second accommodating portion, a reader connected to the conveyor that reads layer information that represents whether the layer currently processed and formed on a substrate conveyed from the first end of the conveying path is the first layer or the second layer, and a controller that instructs the conveyor to load a substrate to the first accommodating portion when the substrate is conveyed from the first end of the conveying path corresponding to the input layer information that represents the first layer, to load a substrate to the second accommodating portion through the conveyor when the substrate is conveyed from the first end of the conveying path corresponding to the input layer information that represents the second layer, to replace a current reticle with the first reticle in said exposing device and successively unloading substrates from the first accommodating portion to the exposing device through the conveyor when the first number of substrate have been accommodated to the first accommodating portion, and to replace the current reticle with the second reticle and successively unloading substrates from the second accommodating portion to the exposing device through the conveyor when the second number of substrates have been accommodated to the second accommodating portion.

12. The substrate processing system as set forth in claim 11, wherein at least one of a resist coating/developing device, a cleaning device, a thin film forming device, an etching device, an ashing device, and an inspecting device is connected to the first end of the conveying path.

13. The substrate processing system as set forth in claim 11, further comprising:

a resist coating/developing device disposed between said accommodating device and said exposing device.

14. The substrate processing system as set forth in claim 11, further comprising:

an estimator that estimates a time when the first number of substrates are accommodated in the first accommodating portion and a second time when the second number of substrates are accommodated in the second accommodating portion earlier than the other; and a reticle replacer that replaces the current reticle with the first reticle or the second reticle corresponding to the estimated result before the first number of substrate are accommodated in the first accommodating portion or before the second number of substrates are accommodated in the second accommodating portion.

15. A substrate processing system for forming a first layer and a second layer on a substrate, comprising:

an exposing device having a replacer mechanism with a substrate loading opening and a substrate unloading opening, the replacer mechanism replaces a current reticle with a first reticle corresponding to a second layer; and an accommodating device that temporarily accommodates substrates, wherein said accommodating device comprises:

a first conveying path having a first end and a second end, the substrates successively conveyed from the first end, the second end connected to the substrate loading opening side;

a second conveying path having a first end and a second end, the substrates successively conveyed from the first end, the second end connected to the substrate unloading opening side;

a first accommodating portion, disposed along the first conveying path, that accommodates substrates with the first layer;

a second accommodating portion, disposed along the first conveying path, that accommodates substrates with the second layer;

a third accommodating portion, disposed along the second conveying path, that accommodates substrates with the first layer;

a fourth accommodating portion, disposed along the second conveying path, that accommodates substrates with the second layer;

a first conveyor travelable on the first conveying path and that conveys, loads and unloads according to layer information that represents the first layer currently processed and formed on a substrate among the first end and the second end of the first conveying path, the first accommodating portion, and the second accommodating portion; and a second conveyor travelable on the second conveying path and that conveys, loads and unloads according to layer information that represents the second layer currently processed and formed on a substrate among the first end and the second end of the second conveying path, the third accommodating portion, and the fourth accommodating portion.

* * * * *